United States Patent
Van Den Brink

(10) Patent No.: US 7,180,290 B2
(45) Date of Patent: Feb. 20, 2007

(54) METHOD FOR K-SPACE DATA ACQUISITION AND MRI DEVICE

(75) Inventor: Johan Samuel Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 73 days.

(21) Appl. No.: 10/529,841

(22) PCT Filed: Sep. 12, 2003

(86) PCT No.: PCT/IB03/04014

§ 371 (c)(1),
(2), (4) Date: Mar. 31, 2005

(87) PCT Pub. No.: WO2004/031793

PCT Pub. Date: Apr. 15, 2004

(65) Prior Publication Data

US 2006/0033492 A1 Feb. 16, 2006

(30) Foreign Application Priority Data

Oct. 1, 2002 (EP) .................................. 02079089

(51) Int. Cl.
*G01V 3/00* (2006.01)
(52) U.S. Cl. ...................... 324/309; 324/307
(58) Field of Classification Search ................ 324/309, 324/307; 600/410
See application file for complete search history.

(56) References Cited

U.S. PATENT DOCUMENTS 6,044,290 A 3/2000 Vigen et al.
6,492,811 B1* 12/2002 Foxall .......................... 324/309
6,618,607 B2* 9/2003 Song ............................ 600/410

FOREIGN PATENT DOCUMENTS

WO WO 02/35250 A1 5/2002

OTHER PUBLICATIONS

Buonocore, M., et al.; High Spatial Resolution EPI Using an Odd Number of Interleaves; MRM; 1999; 41:1199-1205.
Constable, R.T., et al.; Composite Image Formation in z-Shimmed Functional MR Imaging; MRM; 1999; 42:110-117.
Glover, G.H.; 3D z-Shim Method for Reduction of Susceptibility Effects in BOLD fMRI;MRM; 1999; 42:290-299.
Liang, Z., et al.; Principles of Magnetic Resonance Imaging; IEEE; 2000; chapter 5.2.3, pp. 157-164.

(Continued)

*Primary Examiner*—Louis M. Arana

(57) ABSTRACT

A magnetic resonance imaging method acquires interleaved k-space data from a common 2D region in two or more k-spaces. The k-spaces have a first coordinate axis and a second coordinate axis. The method comprises:
a) sampling into a first direction along the first coordinate axis,
b) applying a first compensation pulse,
c) sampling into a second direction along the first coordinate axis, the second direction being opposite to the first direction, applying a second compensation pulse,
d) repetitively carrying out the steps a) to d),
e) reconstructig the data sampled in the first direction into a first image with first contract characteristics and data sampled in the second direction into a second image with second contrast characteristics different from the first, and,
f) combining the first and second images.

16 Claims, 8 Drawing Sheets

OTHER PUBLICATIONS

Luk Pat, G.T., Reducing Flow Artifacts in Echo-Planar Imaging; MRM; 1997; 37:436-447.

Mansfield, P.; Multi-planar image formation using NMR spin echoes; J. Phys. C: 1977; vol. 10, pp. L55-L58.

Panych, L.P., et al.; Selection of High-Definition 2D Virtual Profiles; MRM; 1999; 41:224-229.

Song, A.W.; Single-Shot EPI with Signal Recovery from the Susceptibility-Induced Losses; MRM; 2001; 46:407-411.

* cited by examiner

METHOD FOR K-SPACE DATA ACQUISITION AND MRI DEVICE

FIELD OF THE INVENTION

The present invention is related to the field of magnetic resonance imaging (MRI), and more particularly, to k-space data acquisition.

BACKGROUND AND PRIOR ART

The k-space notation is widely used in the art of MRI to establish a connection between spatial encoding (phase encoding and frequency encoding in the time domain) and the corresponding image obtained by applying the Fourier transform. For data acquisition in the k-space a sampling trajectory of a frequency-encoded signal is typically used. The basic concepts of the k-space notation are explained in more detail in "Principles of Magnetic Resonance Imaging, a Signal Processing Perspective", Zhi-Pei Liang, Paul C. Lauterbur, IEEE Press Series in Biomedical Engineering, 2000, in particular chapter 5.2.3, pp. 157.

From P. Mansfield, "Multi-planar image formation using NMR spin echoes," J. Phys. C: Solid State Phys., vol. 10, pp. L55–L58, 1977 an MRI method is known which is commonly referred to as echo-planar imaging (EPI). The term EPI is broadly used to refer to the class of high-speed imaging methods that collect a "complete" set of two dimensional encodings during the free induction decay period following a single excitation pulse. Hence, EPI has become a synonym for single-shot imaging, although multi shot EPI methods with interlaced k-space coverage are also in common use.

A key concept of EPI is the use of time-varying gradients to traverse k-space. For k-space data acquisition a variety of trajectories are known from the prior art such as zig-zag trajectory, rectilinear trajectory and spiral trajectory. For a discussion of the various prior art trajectories reference is made to the above referenced book of Liang and Lauterbur, chapter 9.3, pp. 303.

FIG. 1 and FIG. 2 show rectilinear trajectories for k-space EPI data acquisition.

In a first data acquisition step a first partial data acquisition of the k-space of the target region is obtained by following the trajectory as depicted in FIG. 1. The trajectory starts at the central point 100 of the k-space. From there it goes into the lower left corner 102 of the k-space. Starting from the lower left corner the k-space is partially scanned by means of a rectilinear trajectory. As it is known from U.S. Pat. No. 6,618,607 half of the k-space is covered plus an additional seven lines.

After the first partial k-space acquisition in accordance with FIG. 1 a brief z-shimming gradient pulse $z=z_0$ is applied before the second partial k-space data acquisition is performed in accordance with the trajectory of FIG. 2.

The trajectory of FIG. 2 is also rectilinear and starts at the point in k-space where the trajectory of the partial k-space acquisition of FIG. 1 ends.

A k-space acquisition scheme of the type shown in FIGS. 1 and 2 is known from U.S. Pat. No. 6,618,607 and from "Single-Shot EPI With Signal Recovery From the Susceptibility-Induced Losses", Allen W. Song, Magnetic Resonance in Medicine 46:407–411 (2001) for application in functional magnetic resonance imaging (fMRI). Based on each of the partial k-space data acquisitions an image is obtained and the two images are overlapped in order to produce a resulting image.

It is an object of the present invention to provide for an improved method for k-space data acquisition in order to increase the spatial sensitivity of MRI.

SUMMARY OF THE INVENTION

The present invention provides a method, a MRI device and a computer program product featuring improved k-space data acquisition for increased spatial sensitivity of the acquired images.

The present invention is based on the discovery that a forward and subsequent reverse k-space acquisition (cf. FIG. 1 and FIG. 2) leads to brain activations as detected with fMRI in very different places in the target region. In particular this decreases the localisation and sensitivity of the resulting images in the blood oxygenation level-dependent (BOLD) statistical analysis.

The present invention provides a method for k-space data acquisition which overcomes this disadvantage of the prior art. In essence, the data acquisition in at least two k-space is performed in parallel in an interleaved manner. For example after sampling into a first direction in the first k-space a compensation pulse is applied. A sampling is performed in the second k-space in the opposite direction. In the next step another compensation pulse is applied before the first k-space is again sampled in the first direction. The at least two k-spaces cover the same physical region, such as a slice of a patient's body. Individual images, each having its own information content, are associated with their respective k-spaces.

Within the framework of the present application the term compensation pulse indicates a pulse which affects artefacts in the reconstructed image. In particular such compensation pulses affect susceptibility artefacts. Very good results as to compensation of susceptibility artefacts artefacts. Very good results as to compensation of susceptibility artefacts are obtained when magnetic gradient pulses, such as 2-skinned gradient pulses are employed as compensation pulses.

In accordance with a preferred embodiment of the invention an image is formed based on the data samples which have been acquired for each of the at least two k-spaces. The images are combined to form a resulting image which features improved localisation and sensitivity.

The invention is particularly advantageous in that the echo times (TEs) for the two or more k-spaces do only have a small difference of for example less than 1 msec. This compares to the prior art, especially the Song reference, where even in the case of partial k-space coverage of the two echoes, the TEs differ by some eight to ten milliseconds. This results in an amplitude difference of the echo signals which affects the quality of the composite image, for both Sum-of SQuares (SSQ) or Maximum Intensity Projection (MIP) combination. Typically, T2* (transverse relaxation time) being approximately 50 and 30 ms for main magnetic field strengths of 1.5T and 3T, respectively, the amplitude difference between the two images at an echo time difference of 10 ms will amount up to 30–40%, while BOLD related signal variations are typically on the order of 5–10%. Even amplitude correction will hamper adequate composite image formation in the prior art due to the image contrast mechanism of the BOLD effect.

As a consequence the small difference in the TEs which is accomplished in accordance with the invention has the effect to greatly enhance the quality of the composite image. This makes the invention particularly suitable for functional magnetic resonance imaging (fMRI).

It is a further advantage of the present invention that typical EPI corrections to line up echoes from positive and negative read out gradients do not need to be performed as all echoes contributing to one image have the same polarity. This improves the robustness of the IQ per "echo" image.

In accordance with a further preferred embodiment of the invention a larger number of k-spaces is utilized for the data acquisition. An even number of k-spaces is preferred as this has the advantage of not having to use the EPI phase correction when acquiring in both directions. Further it is preferred to apply a $k_y$ gradient pulse after each horizontal scan or after every n-th scan when a number of n of k-spaces with n different compensation values is used.

In accordance with a further preferred embodiment of the invention the TE difference for the two k-space data acquisitions is just the time of one horizontal readout along the $k_x$ axis.

As any $k_y$ line for echo 1 is acquired immediately (one echo spacing, typically 0.5–0.8 ms) prior to the same line for echo 2, the result is that $k_y=0$ (i.e. TE) for two "echo images" is just a single echo spacing apart. Consequently, the contrast (amplitude) of the images is the same, and combined usage of SSQ or MIP works much better in comparison to the Song method.

In accordance with a further preferred embodiment of the invention the echo images are acquired with a partial Fourier coverage methodology. In particular the prior art problems with differing flow sensitivities in backward and forward partial Fourier EPI readouts can be resolved by application of the disclosed method.

In accordance with a further preferred embodiment of the invention the starting point for the sampling is the center of the k-space. From there the trajectory goes to the lower left corner of the first k-space. The following scans in the first k-space always go into the same direction. After each sampling along the $k_x$ axis of the first k-space a compensation pulse such as a z-shimming pulse is applied before a sampling into the opposite direction is performed for the second k-space. This way data acquisition for the two k-spaces is performed concurrently in an interleaved manner.

In accordance with a farther preferred embodiment of the invention the $k_y$ position of the sampling is incremented after each sampling along the horizontal axis in $k_x$ or in $-k_x$ direction. Alternatively the $k_y$ position is incremented only after sampling into the $k_x$ or $-k_x$ direction. In any case a compensation pulse is applied after each horizontal sampling in the $k_x$ and $-k_x$ directions for the interleaved data acquisition.

In accordance with a further preferred embodiment of the invention the k-space data acquisition is performed partially for both k-spaces. This means that the combined trajectories of the k-space data acquisition cover half the k-space plus an additional couple of lines. This way the read out time is reduced.

A further substantial advantage of the proposed method is that it enables to solve the problem of combining backward and forward partial fourier. This allows a shorter echo time, and it makes the functional contrast equal, especially by removing the difference in flow sensitivity.

In accordance with a further preferred embodiment of the invention the method of the invention is implemented in a computer program product. The computer program product can be used for the control unit of an MRI device in order to perform a method of the invention.

BRIEF DESCRIPTION OF THE DRAWINGS

In the following preferred embodiments of the invention will be described in greater detail by making reference to the drawings in which.

DETAILED DESCRIPTION

Figure 1:
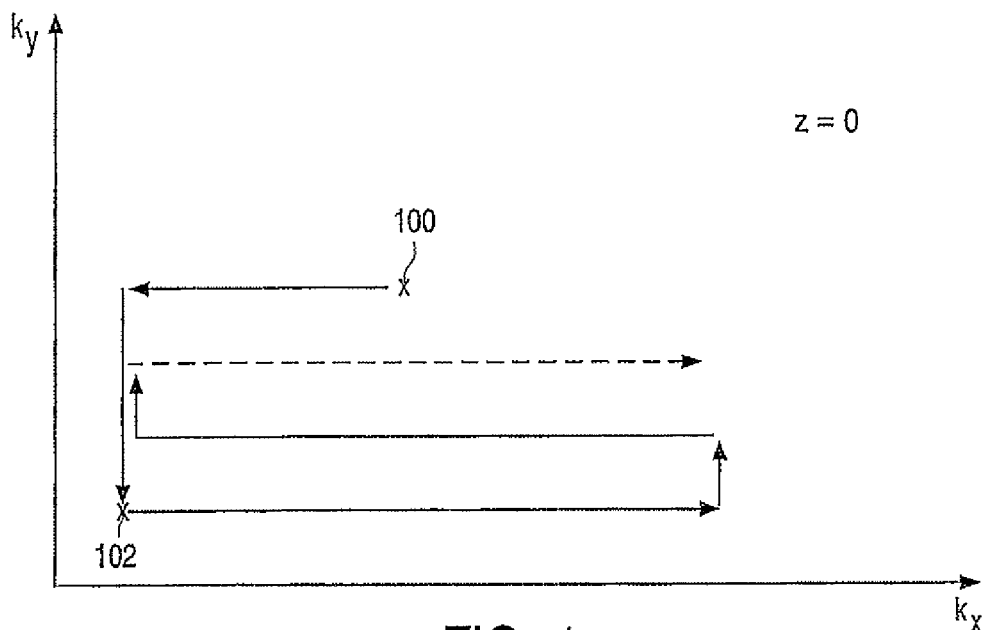
FIG. 1 is a prior art example for partial k-space data acquisition.
Figure 2:
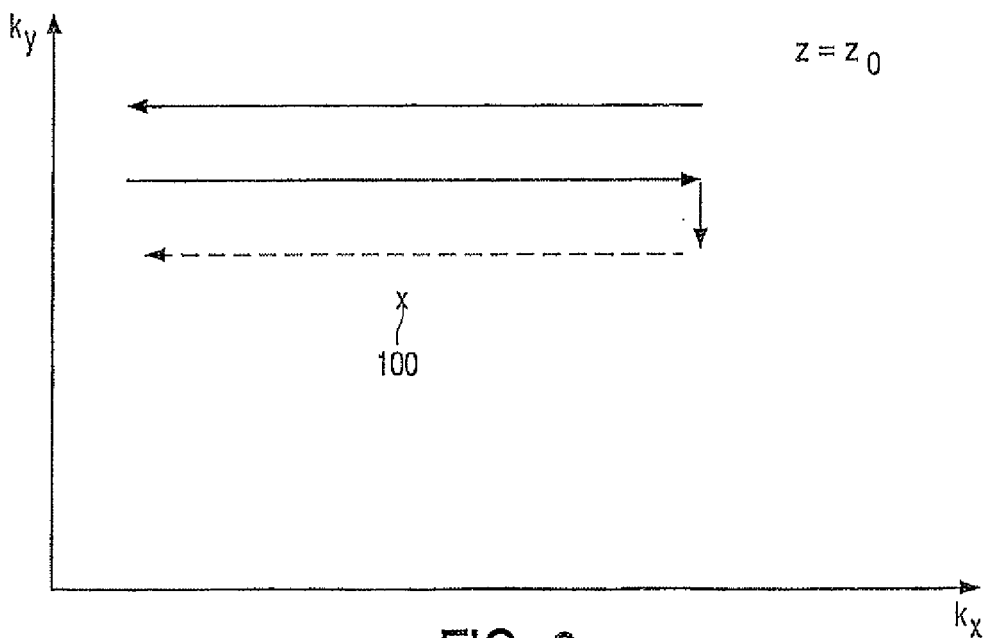
FIG. 2 is a prior art example for partial k-space data acquisition which is subsequent to the data acquisition of FIG. 1 after application of a compensation pulse.
Figure 3:
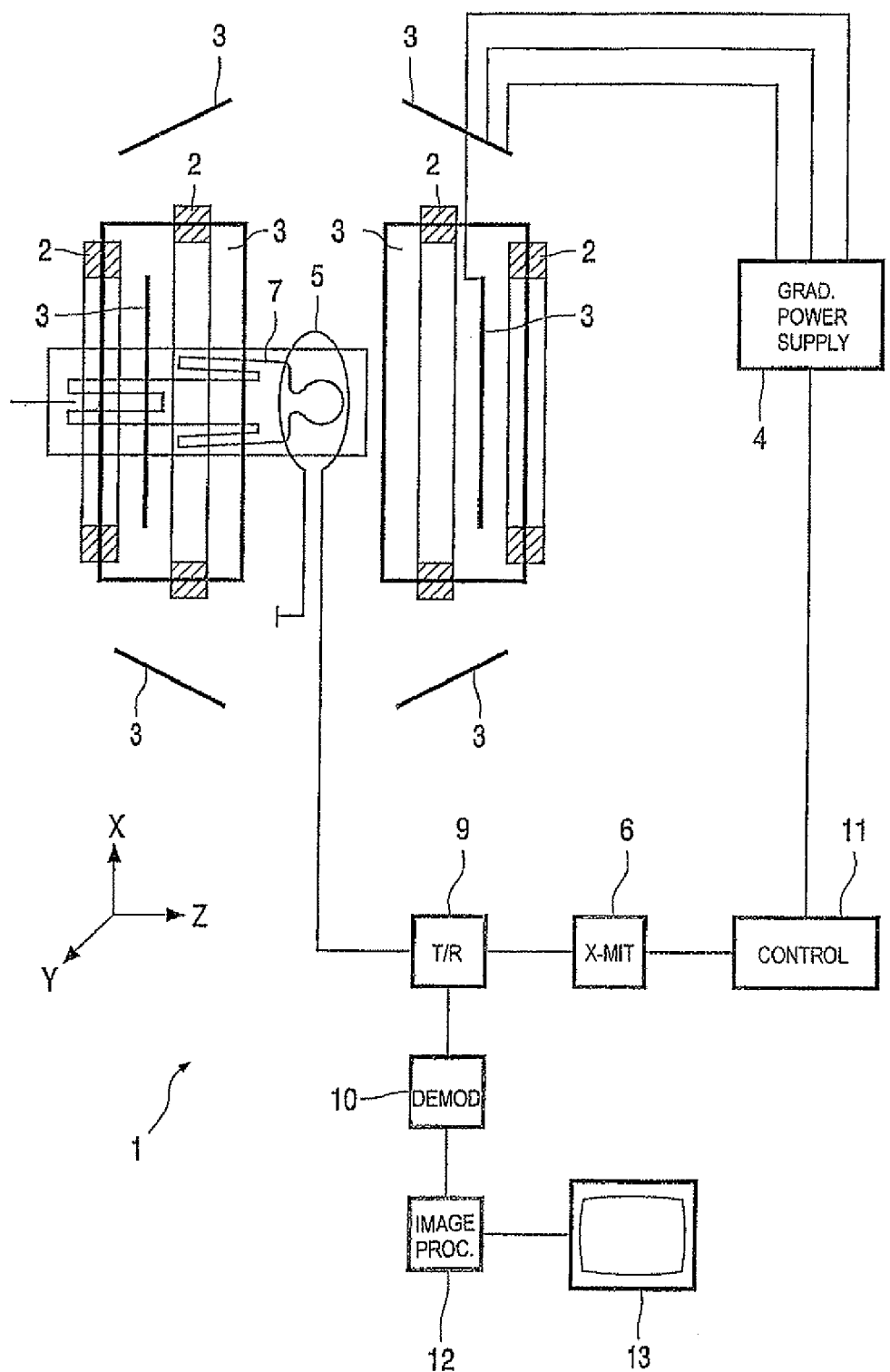
FIG. 3 shows a MR devices having a control unit being programmed in accordance with an embodiment of a method of the invention.

FIG. 3 shows a magnetic resonance device 1 which includes a first magnet system 2 for generating a steady magnetic field, and also several gradient coils 3 for generating additional magnetic fields having a gradient in the X, Y, Z directions. The Z direction of the co-ordinate system shown corresponds to the direction of the steady magnetic field in the magnet system 2 by convention. The measuring co-ordinate system x, y, z to be used can be chosen independently of the X, Y, Z system shown in FIG. 3. The gradient coils are fed by a power supply unit 4. An RF transmitter coil 5 serves to generate RF magnetic fields and is connected to an RF transmitter and modulator 6.

A receiver coil is used to receive the magnetic resonance signal generated by the RF field in the object 7 to be examined, for example a human or animal body. This coil may be the same coil as the RF transmitter coil 5. Furthermore, the magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9.

The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values (also referred to as k-space) so as to form an image by transformation. This image can be visualized, for example by means of a monitor 13.

Figure 4:
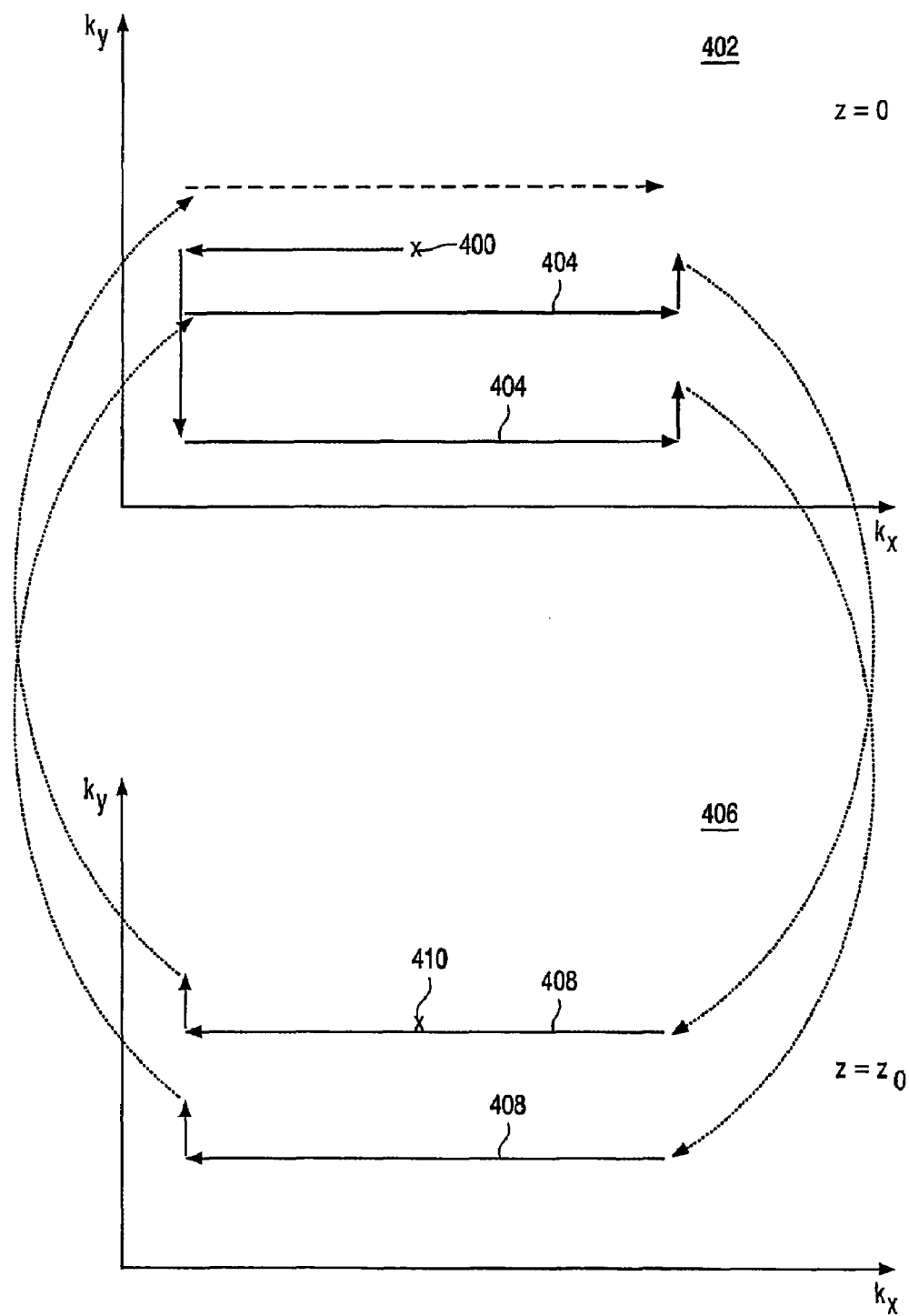
FIG. 4 is illustrative of an embodiment of a k-space data acquisition method in accordance with the invention.

FIG. 4 is illustrative of a method for k-space data acquisition in accordance with the invention. The starting point for the k-space data acquisition is the central point 400 of the k-space 402. From central point 400 the trajectory goes to the left in the $-k_x$ direction and then to the lower left corner of the k-space 402 in the $-k_y$ direction.

Taking the lower left corner of the k-space 402 as a starting point a sampling 404 is performed in the $k_x$ direction. After that the $k_y$ position is incremented by applying a corresponding gradient pulse. Further a compensation pulse such as a z-shimming pulse is applied.

This way the trajectory continues in the k-space 406 where a sampling 408 is performed in the $-k_x$ direction. After the sampling 408 the $k_y$ position is further increased by applying a further gradient pulse and another compensation pulse is applied such that the trajectory continues in the k-space 402.

In k-space 402 another sampling 404 is performed in the $k_x$ direction. After that again the $k_y$ position is incremented and a compensation pulse is applied. As a consequence the trajectory continues in the k-space 406 where another sampling 408 is performed in the $-k_x$ direction etc. By continuing this operation of alternately sampling the k-spaces 402 and 406 k-space data acquisition is performed for both k-spaces 402 and 406 concurrently.

The resulting k-spaces 402 and 406 have both been undersampled with alternating ky-lines being acquired. This results in aliased images, which can be 'unfolded' using a multiple receiver coil set-up and known coil sensitivity profiles, i.e. by applying parallel imaging, e.g. the SENSE or the SMASH method, or its hybrids and variants.

Preferably the k-space data acquisition is performed only partially for the k-spaces 402 and 406 in order to reduce the read-out time.

It is to be noted that the TE is about the same for both k-spaces 402 and 406 when TE is defined as the time from the start of the data acquisition to the time when the central point 400 of the k-space 402 and central point 410 of the k-space 406 are reached by the trajectory. This way the contrast resolution of the resulting image is increased.

Rather than applying a gradient pulse after each horizontal scan to increase the $k_y$ position this can also be done only after every second scan. For example after sampling 404 has been performed no gradient pulse is applied in order to increase the $k_y$ position.

Rather only a compensation pulse is applied before sampling 408 is carried out on the same $k_y$ position. After sampling 408 the $k_y$ position is incremented by means of a corresponding gradient pulse.

Further it is important to note that the gradient pulse to increase the $k_y$ position and the compensation pulse can be applied concurrently.

Figure 5:
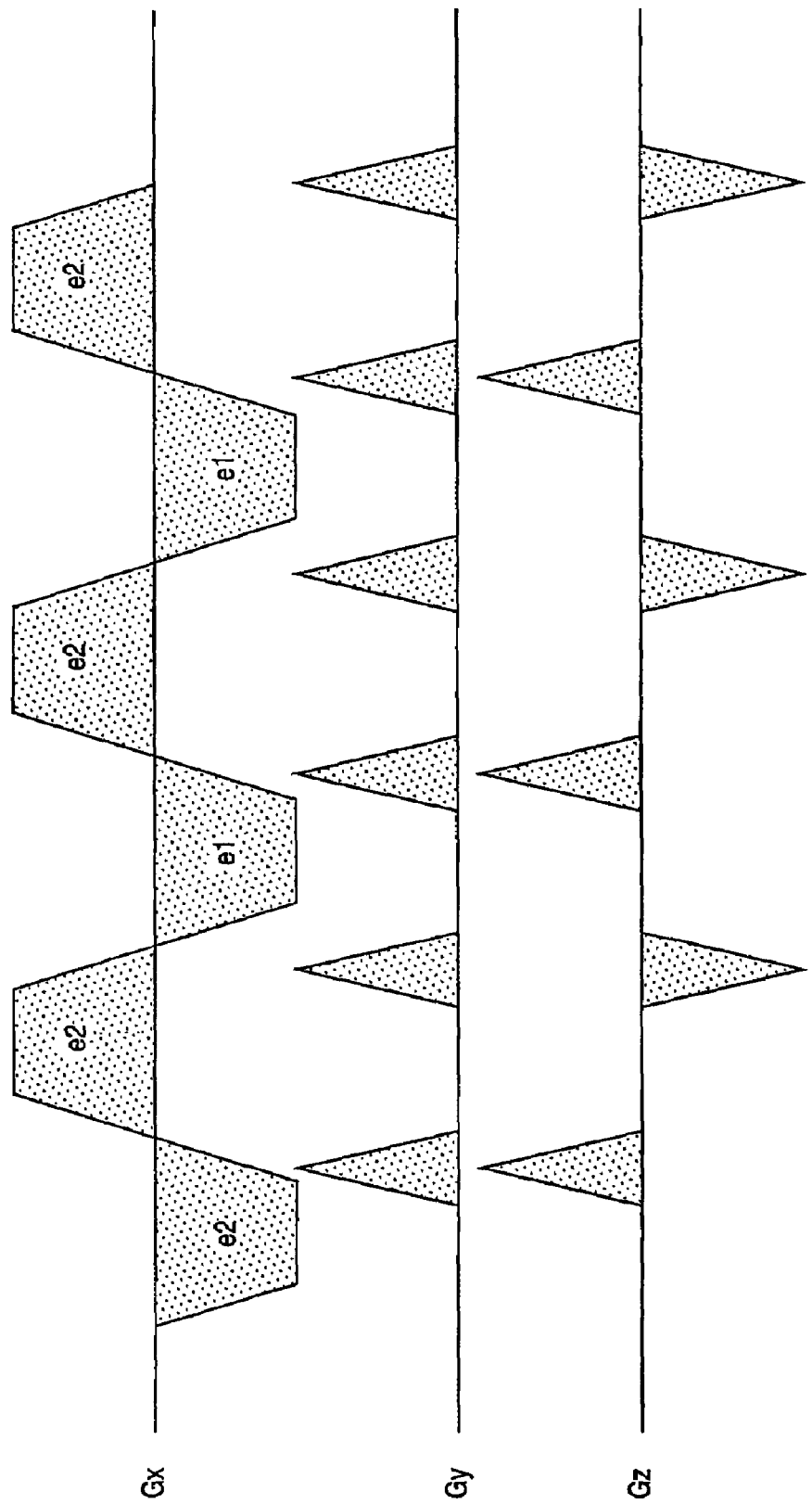
FIG. 5 is illustrative of a gradient switching diagram for the k-space data acquisition of FIG. 4.

FIG. 5 shows a diagram of the gradient channel signals for the embodiment of FIG. 4 where the $k_y$ position is incremented after every horizontal scan.

The signal Gx is illustrative of the horizontal gradient pulses which are applied for horizontal sampling along the $k_x$ or $-k_x$ axis. The signal Gx has negative pulses e1 and positive pulses e2. The signal Gx is constituted by an alternating sequence of negative pulses e1 and positive pulses e2. For example a negative pulse e1 corresponds to one sampling into the $k_x$ direction (cf. sampling 404 of FIG. 4) whereas a positive pulse e2 corresponds to a sampling into the opposite direction (cf. sampling 408 of FIG. 4).

The signal Gy represents the gradient pulses which are applied for incrementing the $k_y$ positions of the data samplings. A Gy pulse is applied after each e1 and after each e2 pulse in the embodiment considered here.

The signal Gz is illustrative of compensation pulses, such as z-shimming compensation pulses, which are applied during the data acquisition in order to "switch" between the two k-spaces (cf. k-spaces 402 and 406 of FIG. 4). A compensation pulse is applied after each signal e1 or e2.

It is important to note, that the k-space lines for the two images obtained are sampled in an interleaved manner, and that as a consequence, all read-outs for one of the k-spaces have the same sign. This is advantageous in EPI reconstruction of the individual images (cf. steps 514 and 516) as no phase correction is needed. The final image is obtained as a SSQ or MIP of the two images of the two k-spaces. For the image construction it is a particular advantage that the echo times are equal with only one echo spacing difference.

Figure 6:
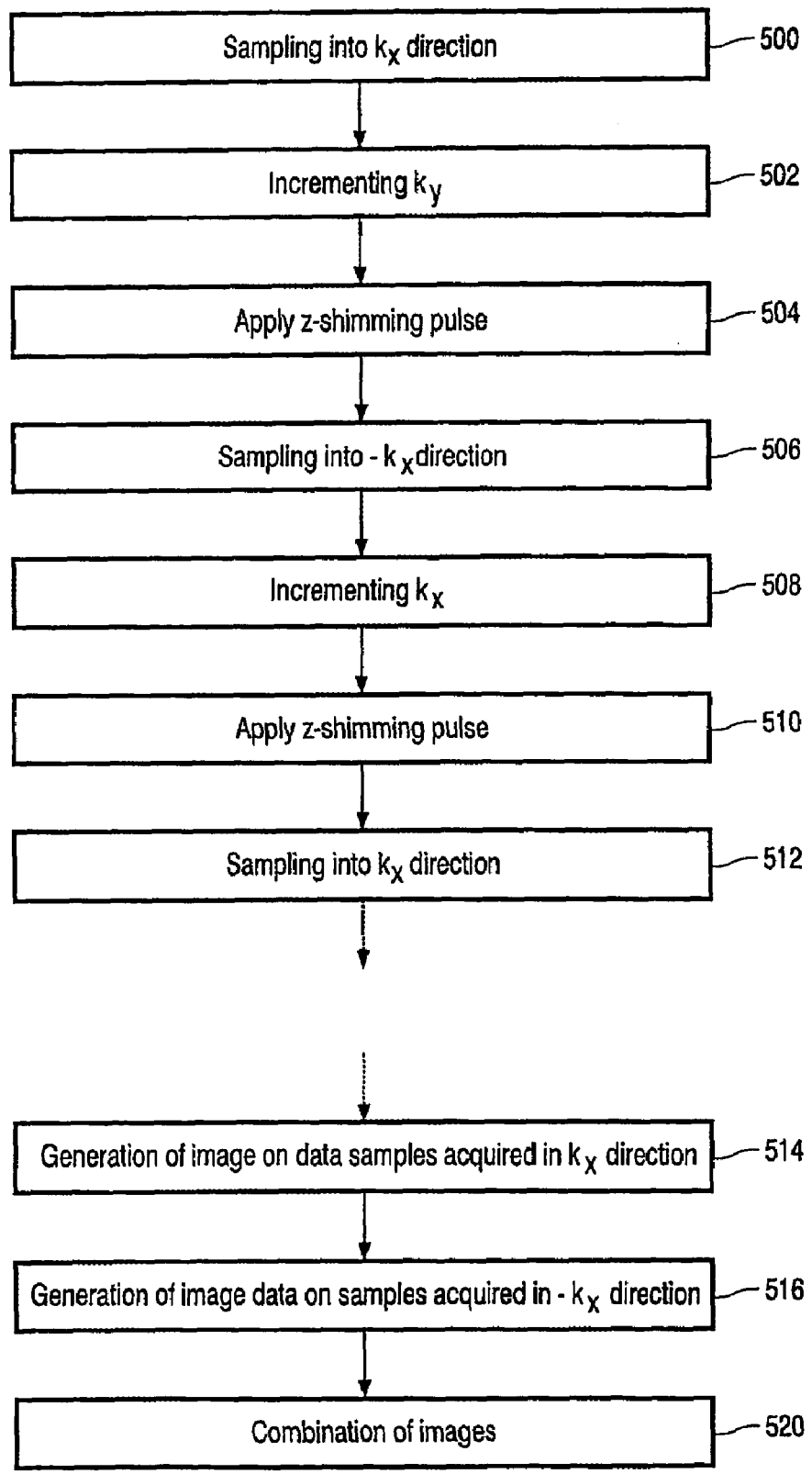
FIG. 6 is illustrative of a flowchart for k-space data acquisition in accordance with the methods of FIG. 4 or 5.

FIG. 6 is illustrative of a corresponding flow diagram.

In step 500 data acquisition is performed into the $k_x$ direction of the first k-space. In step 502 the $k_y$ position for the sampling is incremented by applying a corresponding gradient pulse. In step 504 a z-shimming pulse is applied which brings the trajectory into the other k-space.

In the other k-space a sampling is performed into the opposite $-k_x$ direction. In step 508 $k_y$ is again incremented and another z-shimming pulse is applied in step 510 which brings the trajectory back into the first k-space.

In step 512 another sampling is performed into the $k_x$ direction. This procedure continues until a sufficient amount of data samples for the two k-spaces has been obtained for image generation.

In step 514 a first image is generated based on the data samples acquired in the first k-space by sampling into the $k_x$ direction. Likewise in step 516 a second image is generated based on the data samples acquired in the other k-space by sampling into the opposite direction.

In step 520 the two images of steps 514 and 516 are combined to provide the resulting image.

In essence, FIGS. 5 and 6 are descriptive of a method which employs a parallel imaging reduction factor of 2, and 2 z-shim values: echoes for the first and second image are sampled alternately, and consecutively blips along Gy move to the next $k_y$ line while moving to the next k-space. As such, each individual k-space is undersampled by a factor of 2. The reconstruction of the corresponding aliased images is performed using the known coil sensitivities according to e.g. the SENSE or the SMASH methodology. The z-shim gradient is applied between the echoes for the first and second image, and rewound before acquiring the next $k_y$ position echo for the first image.

Figure 7:
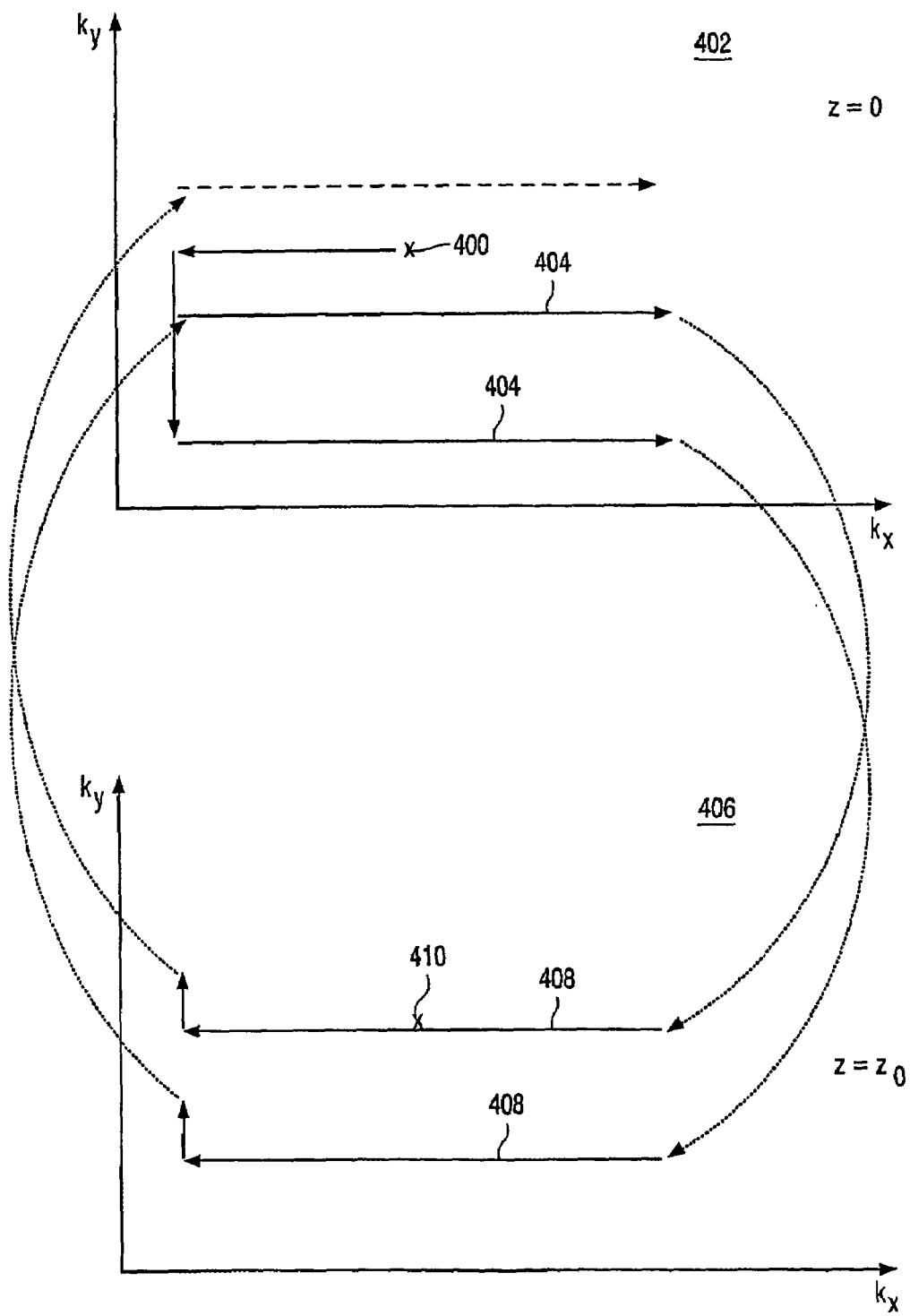
FIG. 7 is illustrative of an embodiment of a k-space data acquisition method where a $k_y$ gradient pulse is applied after every second horizontal scan.

FIG. 7 is illustrative of an alternative method for a k-space data acquisition. The same reference numerals are used in FIG. 7 as in FIG. 4 in order to designate like elements. In contrast to the embodiment of FIG. 4 a $k_y$ gradient pulse is applied only after every second horizontal scan in the k-space 406.

Figure 8:
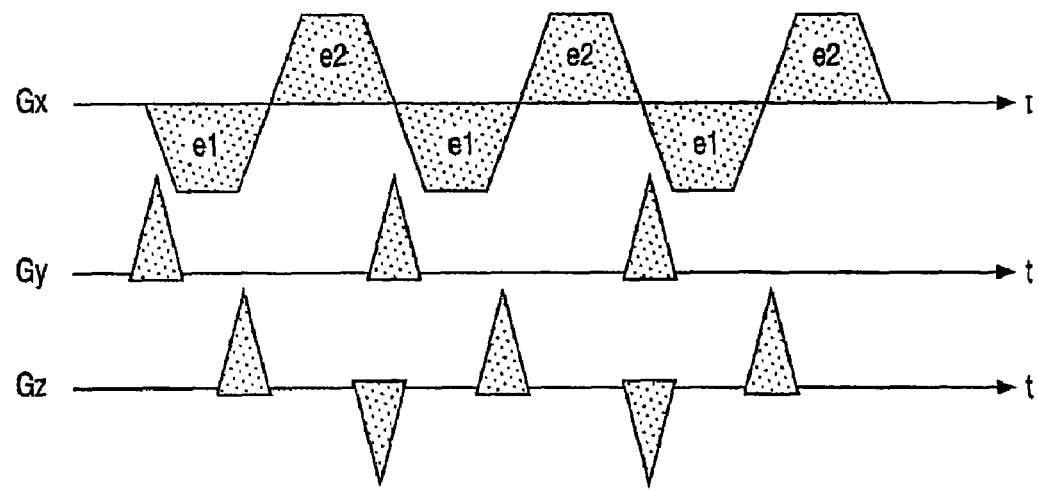
FIG. 8 is illustrative of a gradient switching diagram in accordance with the embodiment of FIG. 7 of the inventive method.

FIG. 8 shows a diagram of the representative gradient channel signals for the preferred embodiment where the $k_y$ position is incremented after every second horizontal scan. In the embodiment considered here a Gy pulse is applied after each pair of e1 and e2 pulses.

Figure 9:
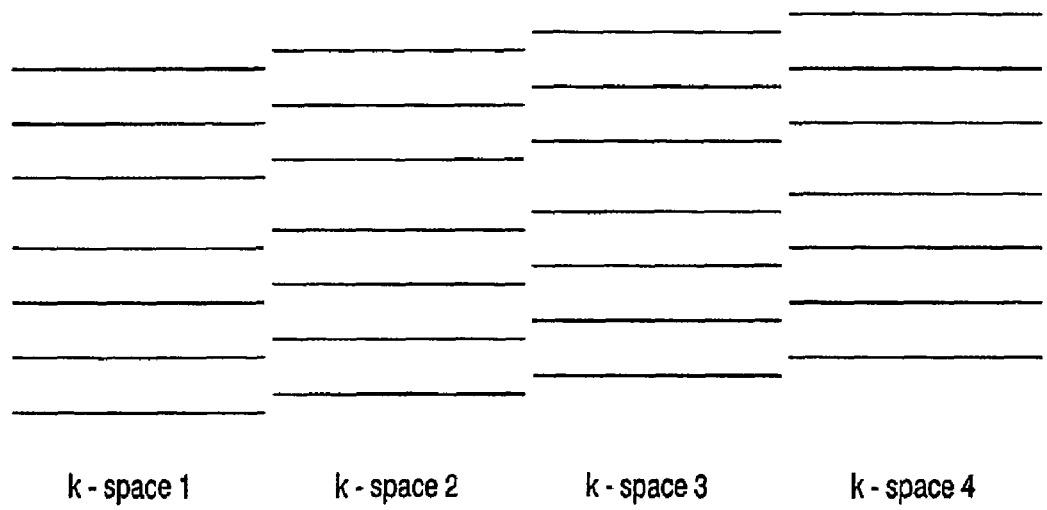
FIG. 9 is illustrative of an embodiment of a k-space data acquisition method with a number of n=4 k-spaces.
Figure 10:
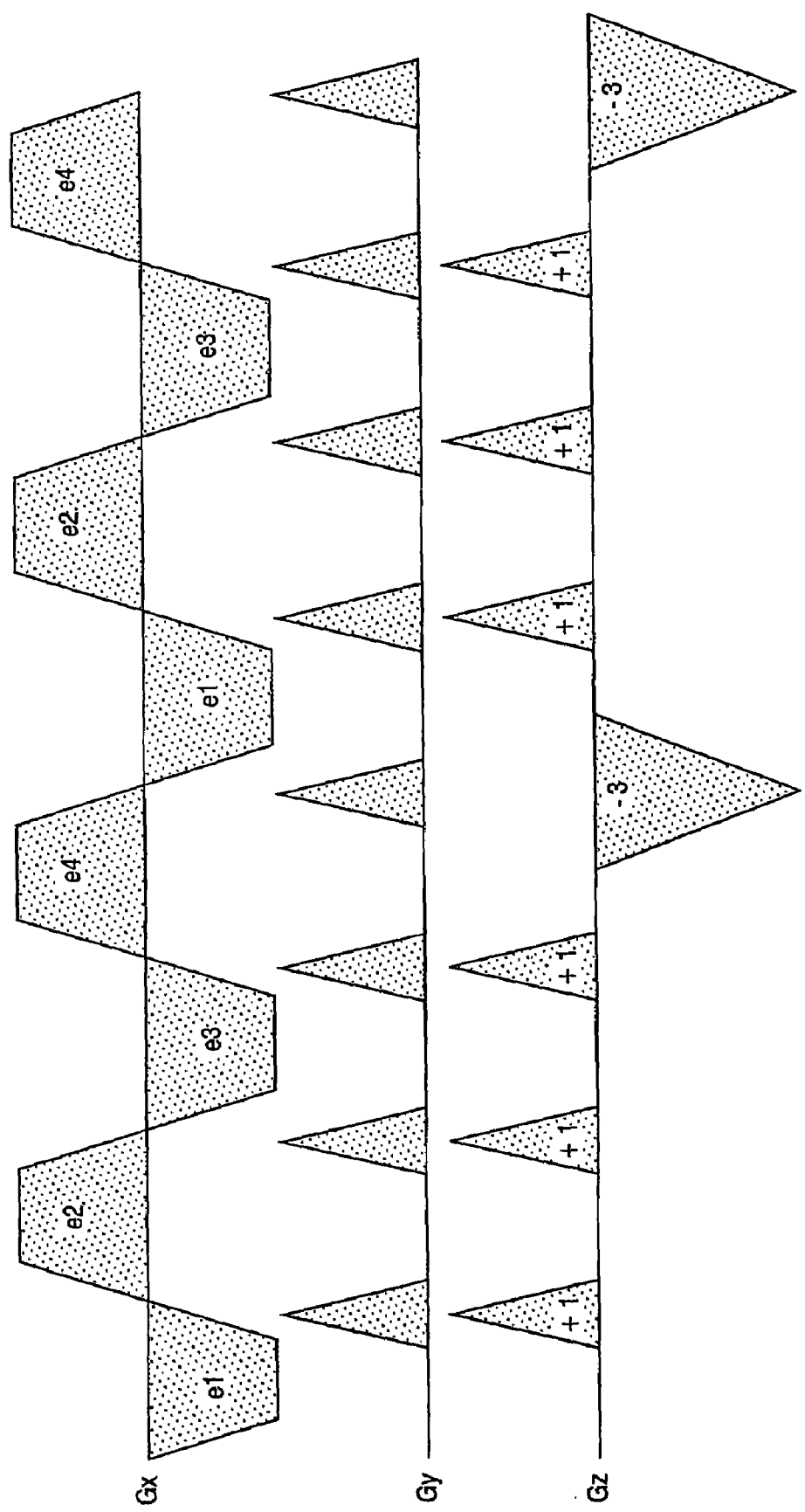
FIG. 10 is illustrative of a gradient switching diagram in accordance with the k-space data acquisition method of FIG. 9.

FIG. 9 is illustrative of an embodiment where an interleaved k-space data acquisition scheme is used which involves a number of n=4 k-spaces. FIG. 10 shows the corresponding gradient channel signals. The echoes for the first to the forth image are sampled alternatingly, and consecutive blips along Gy move to the next $k_y$ line while moving to the next k-space. The z-shim gradient is applied between the echoes for the first, second, third and forth image, and rewound before acquiring the next $k_y$ position echo for the first image. This way a parallel imaging reduction factor r of r=n=4 is accomplished.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

LIST OF REFERENCE NUMERALS magnetic resonance device 1
magnet system 2
gradient coil 3
supply unit 4
transmitter coil 5
modulator 6
object 7
transmission/reception circuit 9
demodulation unit 10
control unit 11
processing unit 12
monitor 13
central point 100
corner 102
central point 400
k-space 402
sampling 404
k-space 406
sampling 408
central point 410

The invention claimed is:

1. A method for k-space data acquisition for magnetic resonance imaging (MRI) using of at least first and second k-spaces for interleaved data acquisition, the at least first and second k-spaces covering substantially the same 2D physical region, the k-spaces having a first coordinate axis and a second coordinate axis, the method comprising:
   a) sampling into a first direction along the first coordinate axis,
   b) applying a first compensation pulse,
   c) sampling into a second direction along the first coordinate axis, the second direction being opposite to the first direction,
   d) applying a second compensation pulse,
   e) incrementing a sampling position on the second coordinate axis,
   f) repetitively carrying out the steps a) to e),
   g) generating a first image with first characteristics based on the data samples being acquired in the first direction,
   h) generating a second image with second characteristics based on the data samples acquired in the second direction, and,
   i) combining the first and second images into one image.

2. The method of claim 1, the first and second compensation pulses being z-shimming pulses.

3. The method of claim 1, further comprising incrementing a sampling position on the second coordinate axis after each step a) and after each step b).

4. The method of claim 1, further comprising performing a partial k-space data acquisition by means of the sampling in steps a) and c).

5. The method of claim 1, whereby a number of n k-spaces is used for the interleaved data acquisition, and further comprising the steps of:

applying a number of n−1 first compensation pulses of a first amplitude,
   applying the second compensation pulse with a second amplitude, where the second amplitude is n−1 times the first amplitude.

6. The method of claim 1 further comprising:
   applying phase-encode pulse after every second sampling step to increment a sampling position such that the compensation pulses are applied after every sampling step and the sampling position is incremented after every second sampling step.

7. The method of claim 1 wherein the sampling steps undersample the first and second k-spaces and wherein the combining step includes applying one of SENSE and SMASH methodology in accordance with coil sensitivities.

8. The method of claim 1 wherein the first compensation pulse causes a next sampling in the second direction to have the second characteristic and the second compensation pulse is a rewind pulse that causes a next sampling in the first direction to again have the first characteristic.

9. The method of claim 1 wherein the first and second characteristics include at least one of susceptibility characteristics, contrast characteristics, and dephasing characteristics.

10. A magnetic resonance imaging device comprising:
    means for interleaved k-space data acquisition in at leaste first and second k-spaces, the k-spaces having a first coordinate axis and a second coordinate axis,
    a control unit for generating of control signals for the means for k-space data acquisition, the control signals causing the means for k-space data acquisition to:
    a) sample into a first direction along the first coordinate axis,
    b) apply a first z-shimming pulse,
    c) sample into a second direction along the first coordinate axis, the second direction being opposite of the first direction,
    d) apply a second z-shimming pulse,
    e) repetitively carry out the steps a) to d);
    a reconstruction means for reconstructing the data acquired in the first direction into a first image and the data acquired in the second direction into a second image;
    a means for combining the first and second images into a hybrid image.

11. The magnetic resonance device of claim 10 wherein the first, second, and hybrid images are 2D images of a common physical region.

12. The magnetic resonance device of claim 11 wherein the combining means combines the first and second 2D images using one of a sum of the squares and a maximum intensity projection.

13. A computer program product for k-space data acquisition for magnetic resonance imaging (MRI), the computer program product performing k-space data acquisition in at least first and second k-spaces having a first coordinate access in an interleaved way, by performing the steps of:
    a) sampling into a first direction along the first coordinate axis,
    b) applying a first compensation pulse,
    c) sampling into a second direction along the first coordinate axis, the second direction being opposite to the first direction,
    d) applying a second compensation pulse,
    e) repetitively carrying out the steps a) to d), f) reconstructing the data acquired in the first direction into a first image of a selected physical region, g) reconstructing the data acquired in the second direction into a second image of the selected physical region, h) combining the first and second images into a third image of the selected region.

14. The computer program of claim 13 wherein the compensation pulses include z-shimming pulses.

15. The computer program of claim 13 wherein the reconstructing steps include applying one of SENSE and SMASH methodology in accordance with coil sensitivities.

16. The computer program of claim 13 wherein the steps further include:

applying a phase encoding pulse after at least one of each step a) and each step b).

* * * * *